United States Patent
Sato et al.

(10) Patent No.: US 11,610,789 B2
(45) Date of Patent: Mar. 21, 2023

(54) SEMICONDUCTOR MANUFACTURING APPARATUS AND METHOD OF MANUFACTURING SEMICONDUCTOR DEVICE

(71) Applicant: Kioxia Corporation, Tokyo (JP)

(72) Inventors: Katsuhiro Sato, Yokkaichi (JP); Hiroshi Fujita, Mie (JP); Yoshinori Kitamura, Tsu (JP); Satoshi Nakaoka, Yokkaichi (JP); Tomohiko Sugita, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/119,043

(22) Filed: Dec. 11, 2020

(65) Prior Publication Data

US 2021/0280438 A1 Sep. 9, 2021

(30) Foreign Application Priority Data

Mar. 5, 2020 (JP) .............................. JP2020-037948

(51) Int. Cl.
*H01L 21/67* (2006.01)
*H01L 21/306* (2006.01)

(52) U.S. Cl.
CPC .. *H01L 21/67075* (2013.01); *H01L 21/30608* (2013.01); *H01L 21/6708* (2013.01); *H01L 21/67023* (2013.01); *H01L 21/67086* (2013.01)

(58) Field of Classification Search
None
See application file for complete search history.

(56) References Cited

U.S. PATENT DOCUMENTS

| | | | | |
|---|---|---|---|---|
| 3,808,071 A | * | 4/1974 | Lerner | H01J 9/144 216/41 |
| 4,967,777 A | * | 11/1990 | Takayama | B08B 3/04 134/182 |
| 5,327,921 A | | 7/1994 | Mokuo et al. | |
| 5,482,068 A | * | 1/1996 | Kitahara | B08B 3/04 134/182 |
| 5,817,185 A | * | 10/1998 | Shindo | H01L 21/67057 134/25.4 |
| 5,921,257 A | * | 7/1999 | Weber | B01J 19/26 257/E21.228 |

(Continued)

FOREIGN PATENT DOCUMENTS

JP 5-251420 A 9/1993
JP 5-82243 B2 11/1993

(Continued)

*Primary Examiner* — Sylvia MacArthur
(74) *Attorney, Agent, or Firm* — Oblon, McClelland, Maier & Neustadt, L.L.P.

(57) ABSTRACT

In one embodiment, a semiconductor manufacturing apparatus includes a container configured to contain a substrate, and a pipe configured to supply the container with liquid to treat the substrate. The apparatus further includes an ejector including a first passage where the liquid introduced from the pipe and the liquid introduced from the container are joined and pass through, and a first opening configured to eject the liquid that has passed through the first passage. Furthermore, the first passage has an area where a sectional area of the first passage becomes large as advancing downstream in the liquid.

7 Claims, 6 Drawing Sheets

(56) References Cited

U.S. PATENT DOCUMENTS

| | | | |
|---|---|---|---|
| 6,199,563 B1 * | 3/2001 | Uehara | H01L 21/30608 211/41.18 |
| 6,539,963 B1 * | 4/2003 | Dunn | B08B 3/102 134/182 |
| 6,575,178 B1 * | 6/2003 | Kamikawa | B08B 3/10 134/88 |
| 7,045,040 B2 * | 5/2006 | Basol | C25D 21/04 204/198 |
| 7,544,624 B2 * | 6/2009 | Kennedy | H01L 21/6708 216/83 |
| 8,388,800 B2 * | 3/2013 | Bai | H05K 3/0085 134/131 |
| 9,691,639 B2 * | 6/2017 | David | B08B 3/04 |
| 2016/0250606 A1 * | 9/2016 | Nasman | B01F 25/432 366/173.1 |
| 2017/0309501 A1 | 10/2017 | Kitamura et al. | |
| 2018/0082862 A1 | 3/2018 | Ashidate et al. | |
| 2018/0233383 A1 | 8/2018 | Ashidate et al. | |
| 2019/0259639 A1 | 8/2019 | Nakaoka et al. | |
| 2019/0385867 A1 | 12/2019 | Sugita et al. | |
| 2020/0273726 A1 | 8/2020 | Nakaoka et al. | |
| 2020/0273727 A1 | 8/2020 | Nakaoka et al. | |
| 2021/0280438 A1 * | 9/2021 | Sato | H01L 21/6708 |

FOREIGN PATENT DOCUMENTS

| | | | |
|---|---|---|---|
| JP | 11-290801 A | | 10/1999 |
| JP | 2000005710 A | * | 1/2000 |
| JP | 3029131 B2 | | 4/2000 |
| JP | 2002-231683 A | | 8/2002 |
| JP | 2017-195338 A | | 10/2017 |
| JP | 2018-46262 A | | 3/2018 |
| JP | 2018-133551 A | | 8/2018 |
| JP | 2019-145686 A | | 8/2019 |
| JP | 2019-220560 A | | 12/2019 |
| JP | 2020-21822 A | | 2/2020 |
| JP | 2020-136537 A | | 8/2020 |
| JP | 2020-141006 A | | 9/2020 |

* cited by examiner

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2020-037948, filed on Mar. 5, 2020, the entire contents of which are incorporated herein by reference.

FIELD

Embodiments described herein relate to a semiconductor manufacturing apparatus and a method of manufacturing a semiconductor device.

BACKGROUND

When a substrate is treated with liquid such as an etchant, a problem may be caused in the substrate or the liquid due to a flow velocity distribution of the liquid or the like.

DETAILED DESCRIPTION

Embodiments will now be explained with reference to the accompanying drawings. In FIGS. 1 to 9, same signs are attached to same configurations and redundant description is omitted.

In one embodiment, a semiconductor manufacturing apparatus includes a container configured to contain a substrate, and a pipe configured to supply the container with liquid to treat the substrate. The apparatus further includes an ejector including a first passage where the liquid introduced from the pipe and the liquid introduced from the container are joined and pass through, and a first opening configured to eject the liquid that has passed through the first passage. Furthermore, the first passage has an area where a sectional area of the first passage becomes large as advancing downstream in the liquid.

First Embodiment

Figure 1:
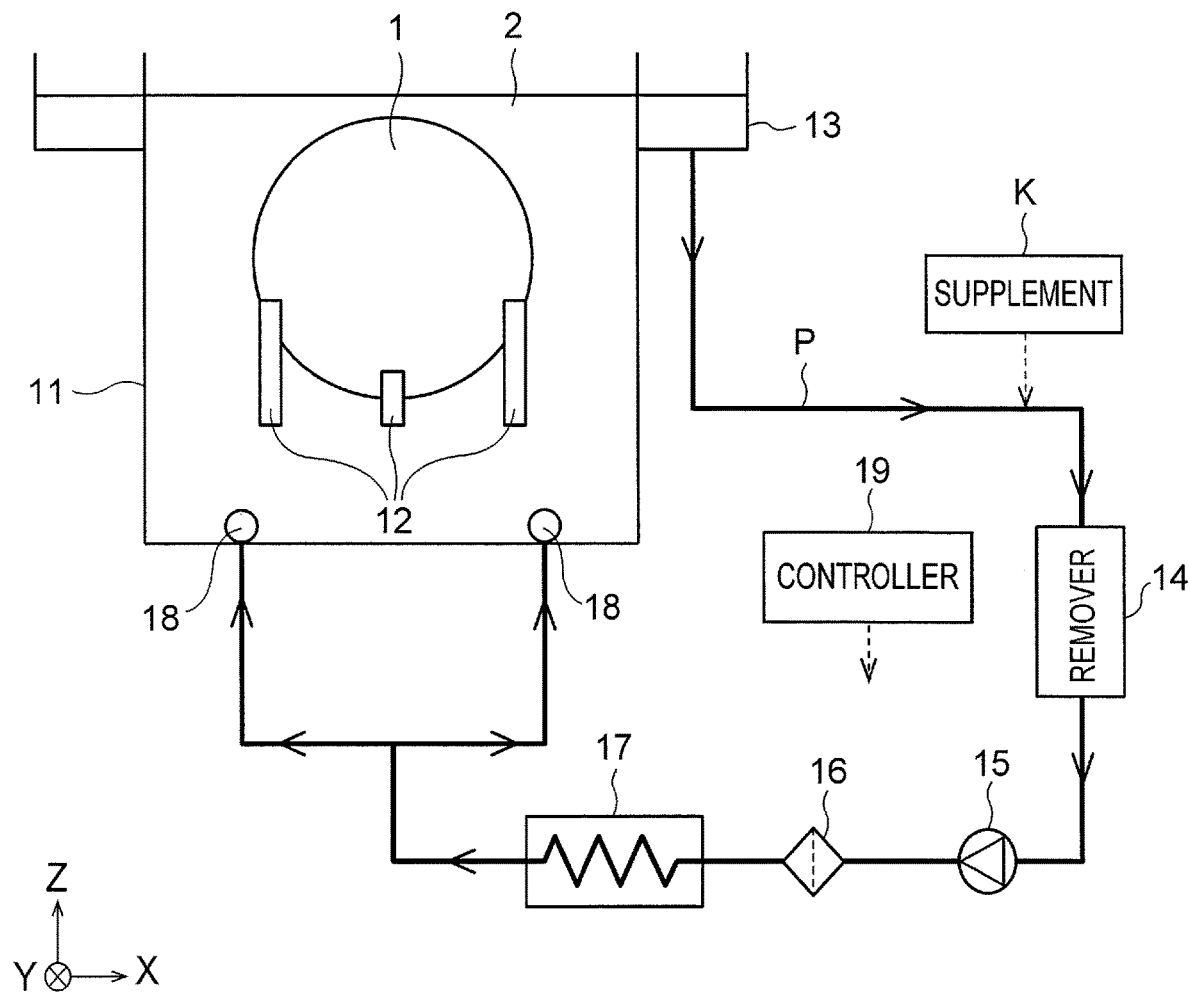
FIG. 1 is a schematic diagram illustrating a configuration of a semiconductor manufacturing apparatus of a first embodiment.

FIG. 1 is a schematic diagram illustrating a configuration of a semiconductor manufacturing apparatus of the first embodiment. The semiconductor manufacturing apparatus in FIG. 1 is a batch type substrate treating device which treats a plurality of substrates (wafers) 1 with substrate treating liquid 2.

FIG. 1 illustrates one of the substrates 1. Each substrate 1 includes a semiconductor substrate (semiconductor wafer) such as a silicon substrate and a process target film formed on a surface of the semiconductor substrate, for example. The process target film may be any one of a conductor film, a semiconductor film and an insulating layer and may include two or more kinds of films. The process target film of the present embodiment includes a silicon-based film such as a silicon film, a silicon oxide film or a silicon nitride film, and therefore contains a silicon element.

FIG. 1 further illustrates the substrate treating liquid 2 in which the substrates 1 are immersed. The substrate treating liquid 2 is liquid for treating the substrates 1 and is an aqueous solution or a drug solution, for example. The substrate treating liquid 2 of the present embodiment is an etchant for etching the process target film, and is a phosphoric acid aqueous solution, for example.

The semiconductor manufacturing apparatus in FIG. 1 includes a substrate treating tank 11, a substrate holder 12, an overflow module 13, a silica remover 14, a pump 15, a filter 16, a heater 17, a plurality of recirculating pipes 18, and a controller 19. The substrate treating tank 11 is an example of a container, the silica remover 14 is an example of a remover, and the recirculating pipe 18 is an example of a pipe.

FIG. 1 illustrates an X direction and a Y direction which are parallel to an installation surface of the semiconductor manufacturing apparatus and are vertical to each other, and a Z direction which is vertical to the installation surface of the semiconductor manufacturing apparatus. In the present description, a +Z direction is handled as an upper direction and a −Z direction is handled as a lower direction. The −Z direction may coincide with a gravity direction and may not coincide with the gravity direction.

The substrate treating tank 11 contains the plurality of substrates 1 and the substrate treating liquid 2. The substrates 1 are treated with the substrate treating liquid 2 by being immersed in the substrate treating liquid 2 in the substrate treating tank 11. The substrate holder 12 holds the substrates 1 in the substrate treating tank 11. The substrates 1 are held such that a surface and a back surface of each substrate 1 are vertical to the Y direction and the substrates 1 are arranged in parallel to each other.

The substrate treating liquid 2 which overflows from the substrate treating tank 11 is stored in the overflow module 13, and is discharged from the overflow module 13 to a circulating passage P. The silica remover 14, the pump 15, the filter 16 and the heater 17 are provided in series in the circulating passage P. The substrate treating tank 11 and the overflow module 13 correspond to an inner tank and an outer tank, respectively.

The silica remover 14 removes silica from the substrate treating liquid 2 discharged from the overflow module 13. In the present embodiment, the silica is generated by reaction of the substrate 1 and the substrate treating liquid 2, and the substrate treating liquid 2 from the overflow module 13 contains the silica. The silica remover 14 removes at least some silica contained in the substrate treating liquid 2, and discharges the substrate treating liquid 2 from which at least some silica is removed to the pump 15.

In the present embodiment, the silicon nitride film (SiN) included in the process target film reacts with the phosphoric acid aqueous solution ($H_3PO_4$) to generate the silica ($Si(OH)$ 4), and the silica is accumulated in the substrate treating liquid 2. By removing the silica from the substrate treating liquid 2, the silica remover 14 can keep a silica concentration in the substrate treating liquid 2 fixed, and can keep an etching selection ratio of the silicon nitride film and the silicon oxide film ($SiO_2$) included in the process target film fixed. When the etching selection ratio changes, there are a risk that a film not desired to be etched is etched and a risk that the silica precipitates to close a hole and a trench. According to the present embodiment, by removing the silica by the silica remover 14, the problems can be suppressed. The silica remover 14 may be replaced with a remover which removes other substances generated by the reaction of the substrate 1 and the substrate treating liquid 2.

The pump 15 carries the substrate treating liquid 2 through the circulating passage P. The filter 16 purifies the substrate treating liquid 2 flowing through the circulating passage P. The heater 17 heats the substrate treating liquid 2 flowing through the circulating passage P. The substrate treating liquid 2 which has passed through the silica remover 14, the pump 15, the filter 16 and the heater 17 in order is supplied again into the substrate treating tank 11 from the circulating passage P via the recirculating pipes 18. In such a manner, the substrate treating liquid 2 is circulated between the substrate treating tank 11 and the circulating passage P.

Figure 2:
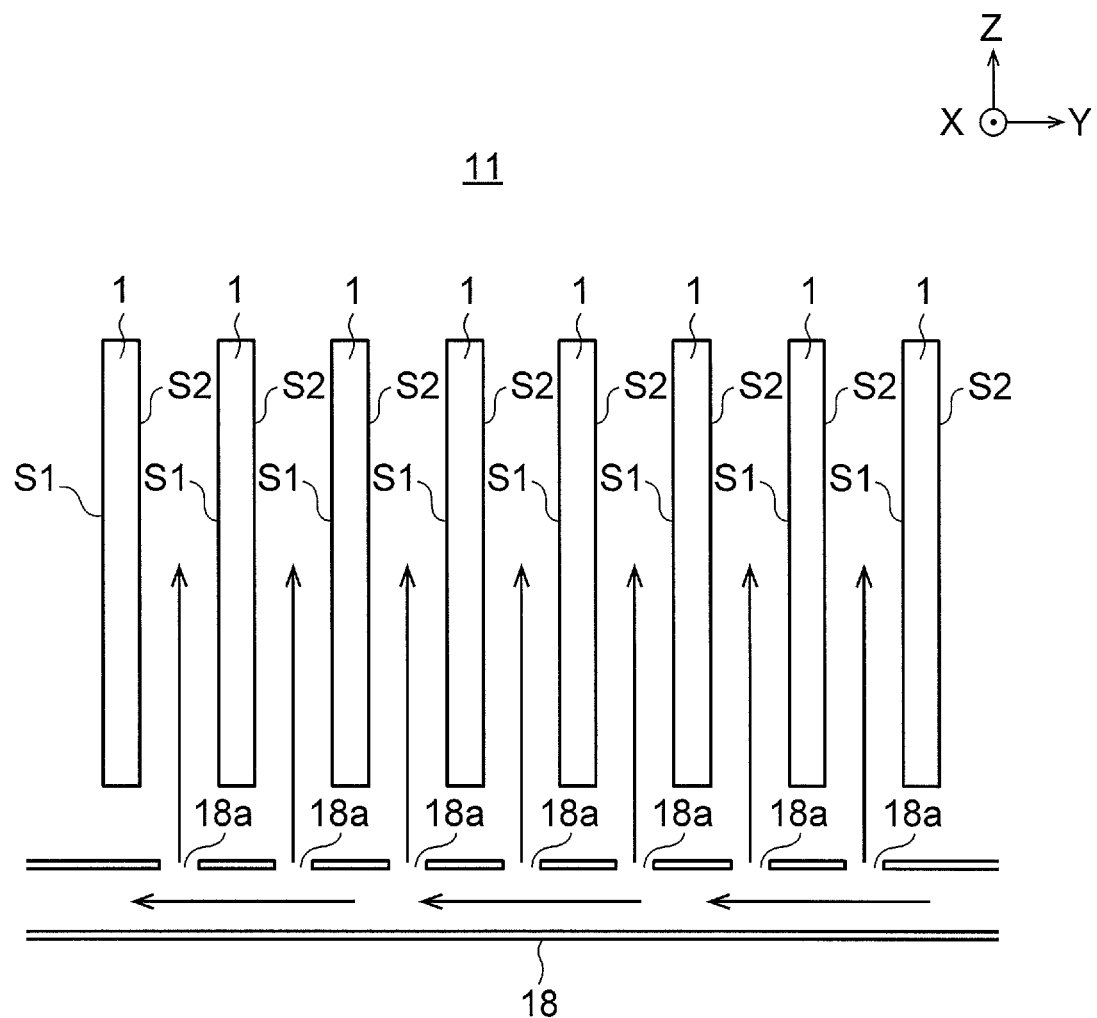
FIG. 2 is a sectional view illustrating a structure of a substrate treating tank of the first embodiment.

FIG. 1 illustrates a cross section of the two recirculating pipes 18. The recirculating pipes 18 extend in the Y direction and are adjacent to each other in the X direction. Each recirculating pipe 18 has a plurality of openings 18a to be described later, and supplies the substrate treating liquid 2 from the openings 18a into the substrate treating tank 11 (FIG. 2). The recirculating pipes 18 of the present embodiment are arranged at a bottom portion of the substrate treating tank 11, and jet out the substrate treating liquid 2 toward the substrates 1 held above the recirculating pipes 18. The recirculating pipes 18 are laid in the substrate treating tank 11 in FIG. 1 but may be laid outside the substrate treating tank 11.

The controller 19 controls an operation of the semiconductor manufacturing apparatus. Examples of the controller 19 are a processor, an electric circuit, a PC (Personal Computer) and the like. The controller 19 can, for example, adjust the silica concentration in the substrate treating liquid 2 by controlling the silica remover 14, adjust a flow rate of the substrate treating liquid 2 by controlling the pump 15, and adjust a temperature of the substrate treating liquid 2 by controlling the heater 17.

FIG. 2 is a sectional view illustrating a structure of the substrate treating tank 11 of the first embodiment.

FIG. 2 illustrates the plurality of substrates 1 contained in the substrate treating tank 11 and the plurality of openings 18a provided on one recirculating pipe 18. The substrates 1 are held so as to be arranged in parallel to each other, and as a result, a plurality of clearances are provided between the substrates 1. An illustration of ejectors 21 to be described later is omitted.

FIG. 2 illustrates a surface S1 and a back surface S2 of each substrate 1. Each substrate 1 of the present embodiment includes, as described above, the semiconductor substrate such as the silicon substrate, and the process target film formed on the surface of the semiconductor substrate. In FIG. 2, the surface S1 corresponds to a surface of the process target film, and the back surface S2 corresponds to a back surface of the semiconductor substrate.

As illustrated by arrows in FIG. 2, the openings 18a of the recirculating pipe 18 jet out the substrate treating liquid 2 to the clearances between the substrates 1. Specifically, the openings 18a and the clearances are in one-to-one correspondence, and each opening 18a jets out the substrate treating liquid 2 to the corresponding clearance. Accordingly, the substrate treating liquid 2 is supplied to the surfaces S1 of the substrates 1 and the films to be processed are treated with the substrate treating liquid 2.

In FIG. 2, the surface S1 of each substrate 1 faces the back surface S2 of the adjacent substrate 1, and the back surface S2 of each substrate 1 faces the surface S1 of the adjacent substrate 1. In other words, the surface S1 of each substrate 1 is in the −Y direction, and the back surface S2 of each substrate 1 is in the +Y direction. However, in the present embodiment, the surface S1 of each substrate 1 may face the surface S1 of the adjacent substrate 1 and the back surface S2 of each substrate 1 may face the back surface S2 of the adjacent substrate 1.

Hereinafter, details of each recirculating pipe 18 of the present embodiment will be described. In the following description, the substrate treating liquid 2 is appropriately abbreviated as "liquid 2".

Figure 3:
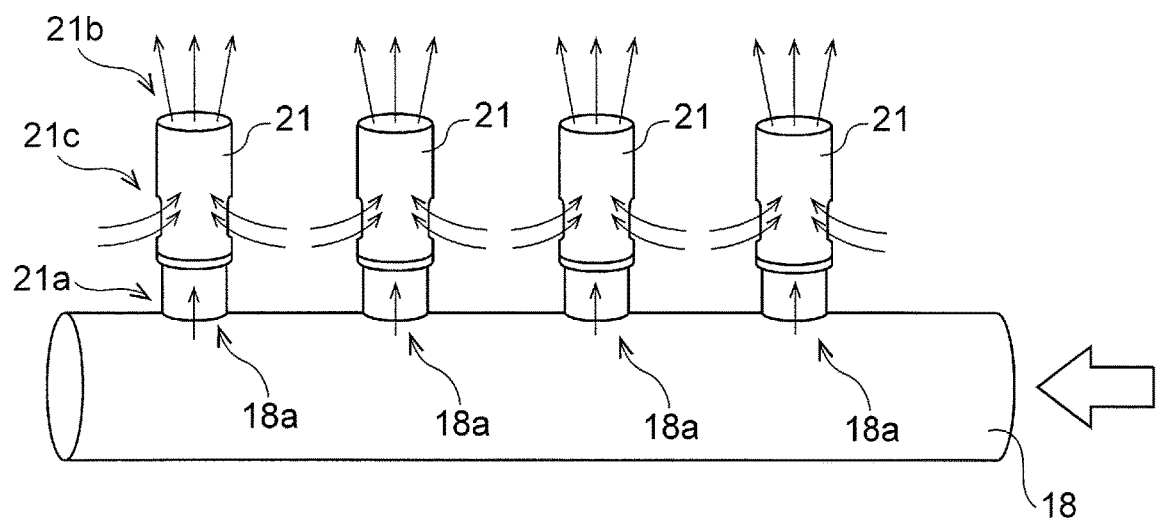
FIG. 3 is a perspective view illustrating a structure of a recirculating pipe of the first embodiment.

FIG. 3 is a perspective view illustrating a structure of the recirculating pipe 18 of the first embodiment.

The semiconductor manufacturing apparatus of the present embodiment includes the plurality of ejectors 21 provided on an outer peripheral surface of the recirculating pipe 18, as illustrated in FIG. 3. The ejectors 21 are arranged in the substrate treating tank 11, and are attached to the plurality of openings 18a of the recirculating pipe 18. Therefore, the liquid 2 flowing through the recirculating pipe 18 is supplied into the substrate treating tank 11 through the openings 18a and the ejectors 21.

The openings 18a of the present embodiment are in one-to-one correspondence with the clearances between the substrates 1, as described with reference to FIG. 2. Therefore, the ejectors 21 of the present embodiment are also in one-to-one correspondence with the clearances between the substrates 1, and each ejector 21 jets out the liquid 2 to the corresponding clearance.

Each ejector 21 includes an opening 21a which introduces the liquid 2 from the recirculating pipe 18 (the opening 18a), and an opening 21b which ejects the liquid 2 into the substrate treating tank 11. Therefore, the liquid 2 can be supplied into the substrate treating tank 11 from the recirculating pipe 18. The opening 21b is an example of a first opening, and the opening 21a is an example of a second opening.

Each ejector 21 further includes at least one opening 21c which introduces the liquid 2 from the substrate treating tank 11. The ejector 21 of the present embodiment introduces the liquid 2 in the recirculating pipe 18 from the opening 21a, and introduces the liquid 2 in the substrate treating tank 11 from the opening 21c. The liquid 2 introduced from the opening 21a and the liquid 2 introduced from the opening 21c are joined in the ejector 21, and the joined liquid 2 is ejected from the opening 21b. In this way, the ejector 21 of the present embodiment not only supplies the liquid 2 introduced from the recirculating pipe 18 into the substrate treating tank 11 but also supplies the liquid 2 introduced from the substrate treating tank 11 into the substrate treating tank 11 again. The opening 21c is an example of a third opening.

Figure 4:
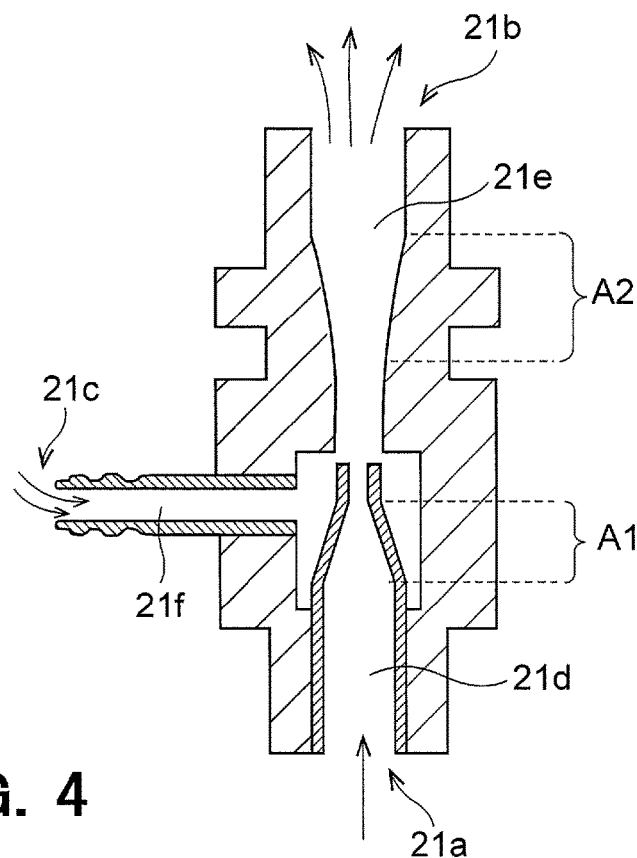
FIG. 4 is a sectional view illustrating a structure of an ejector of the first embodiment.

FIG. 4 is a sectional view illustrating a structure of the ejector 21 of the first embodiment.

The ejector 21 of the present embodiment includes, as illustrated in FIG. 4, the openings 21a, 21b and 21c and passages 21d, 21e and 21f. The passage 21d carries the liquid 2 from the opening 21a into the ejector 21, and the passage 21f carries the liquid 2 from the opening 21c into the ejector 21. The passage 21e carries the liquid 2 from the passage 21d and the passage 21f to the opening 21b. The passage 21e is an example of a first passage.

The liquid 2 introduced from the opening 21a passes through the passage 21d and flows into the ejector 21. Similarly, the liquid 2 introduced from the opening 21c passes through the passage 21f and flows into the ejector 21. The liquid 2 from the passage 21d and the liquid 2 from the passage 21f are joined in the ejector 21, and flow into the passage 21e. Accordingly, the liquid 2 joined in the ejector 21 passes through the passage 21e and is ejected from the opening 21b.

The passage 21d has an area A1 where a sectional area of the passage 21d becomes small as advancing downstream in the liquid 2. The passage 21d of the present embodiment has a tubular shape extending in the +Z direction and has a circular sectional shape. Therefore, a diameter of the passage 21d becomes small as advancing downstream in the liquid 2 (+Z direction) in the area A1. Accordingly, a flow velocity of the liquid 2 can be increased in the area A1. Further, by increasing the flow velocity of the liquid 2, a negative pressure can be generated near exits of the passage 21d and the passage 21f and the liquid 2 can be sucked from the opening 21c into the passage 21f (a Venturi effect).

On the other hand, the passage 21e has an area A2 where a sectional area of the passage 21e becomes large as advancing downstream in the liquid 2. The passage 21e of the present embodiment has a tubular shape extending in the +Z direction and has a circular sectional shape. Therefore, a diameter of the passage 21e becomes large as advancing downstream in the liquid 2 (+Z direction) in the area A2. Accordingly, the passage 21e can be made to function as a diffuser that mixes the liquid 2 from the passage 21d and the liquid 2 from the passage 21f.

Hereinafter, further details of the ejector 21 of the present embodiment will be described.

The semiconductor manufacturing apparatus of the present embodiment generates a flow of the liquid 2 in the substrate treating tank 11 by supplying the liquid 2 from the recirculating pipes 18 into the substrate treating tank 11. However, when the flow of the liquid 2 in the substrate treating tank 11 is not sufficient, a flow velocity distribution of the liquid 2 in the substrate treating tank 11 greatly changes and treatment (etching for example) of the substrates 1 becomes nonuniform. The nonuniformity can be suppressed by enlarging the pump 15 and increasing the flow rate of the liquid 2 flowing through the circulating passage P and the recirculating pipes 18. However, it is not preferable to enlarge the pump 15.

Then, the semiconductor manufacturing apparatus of the present embodiment includes the ejectors 21 provided on the outer peripheral surface of the recirculating pipes 18. The ejectors 21 of the present embodiment not only introduce the liquid 2 from the recirculating pipes 18 but also introduce the liquid 2 from the substrate treating tank 11. Therefore, according to the present embodiment, by ejecting the liquid 2 from the ejectors 21, the flow rate of the liquid 2 jetted into the substrate treating tank 11 can be increased. Accordingly, the change of the flow velocity distribution of the liquid 2 in the substrate treating tank 11 can be reduced, and the nonuniformity of the treatment of the substrates 1 can be suppressed. According to the present embodiment, such nonuniformity can be suppressed without enlarging the pump 15.

In addition, the passage 21e of the ejector 21 of the present embodiment has the area A2 where the sectional area of the passage 21e becomes large as advancing downstream in the liquid 2. Accordingly, the passage 21e can be made to function as the diffuser that mixes the liquid 2 from the passage 21d and the liquid 2 from the passage 21f. Therefore, according to the present embodiment, a concentration of a solute in the former liquid 2 and a concentration of a solute in the latter liquid 2 can be uniformized. The solute in the liquid 2 of the present embodiment is phosphoric acid, for example.

In the present embodiment, for example, with the phosphoric acid in the liquid 2, the silicon nitride film in the process target film is etched. Etching of the silicon nitride film with the phosphoric acid is generally a high temperature process, and water in the liquid 2 tends to volatilize. Therefore, as illustrated in FIG. 1, the water is often supplemented to the liquid 2 in the circulating passage P. FIG. 1 illustrates a supplementing module K which supplements the water to the liquid 2 in the circulating passage P. In this case, the concentration of the phosphoric acid in the liquid 2 flowing through the circulating passage P and the recirculating pipes 18 may be different from the concentration of the phosphoric acid in the liquid 2 in the substrate treating tank 11. When such a concentration difference is left alone, there is the risk that the etching of the silicon nitride film becomes nonuniform. According to the present embodiment, since the passage 21e functions as the diffuser, the concentrations of the phosphoric acid in the liquid 2 from the passage 21d and the liquid 2 from the passage 21f can be uniformized, and the nonuniformity of the etching of the silicon nitride film can be suppressed.

Further, when the silicon nitride film in the process target film is etched with the phosphoric acid in the liquid 2, the silica is generated and the silica is accumulated in the liquid 2 as described above. When the silica is accumulated in the liquid 2, there are the risk that a film not desired to be etched is etched and the risk that the silica precipitates to close a hole and a trench. Then, in the present embodiment, the silica remover 14 is provided in the circulating passage P. Accordingly, by removing the silica by the silica remover 14, the above-described problems can be suppressed.

The supplementing module K may supplement the phosphoric acid to the liquid 2 in the circulating passage P. By supplementing the phosphoric acid from the supplementing module K, the silica which cannot be fully removed in the silica remover 14 can be diluted. In this case, the concentration of the silica in the liquid 2 flowing through the circulating passage P and the recirculating pipes 18 may be different from the concentration of the silica in the liquid 2 in the substrate treating tank 11. When such a concentration difference is left alone, there is the risk that the etching of the silicon nitride film becomes nonuniform. According to the present embodiment, since the passage 21e functions as the diffuser, the concentrations of the silica in the liquid 2 from the passage 21d and the liquid 2 from the passage 21f can be uniformized, and the nonuniformity of the etching of the silicon nitride film can be suppressed.

As described above, the semiconductor manufacturing apparatus of the present embodiment includes the ejectors 21, and the passage 21e of the ejector 21 has the area A2 where the sectional area of the passage 21e becomes large as advancing downstream in the liquid 2. Therefore, according to the present embodiment, when treating the substrate 1 with the liquid 2, it is possible to suppress the occurrence of the problem in the substrates 1 and the liquid 2. For example, the change of the flow velocity distribution of the liquid 2 in the substrate treating tank 11 can be reduced, and the concentration of the solute in the liquid 2 can be uniformized.

The ejector 21 of the present embodiment may have a shape different from the shape illustrated in FIG. 4. For example, the ejector 21 of the present embodiment may include two or more passages 21f that carry the liquid 2 from the substrate treating tank 11 into the ejector 21.

Second Embodiment

Figure 5:
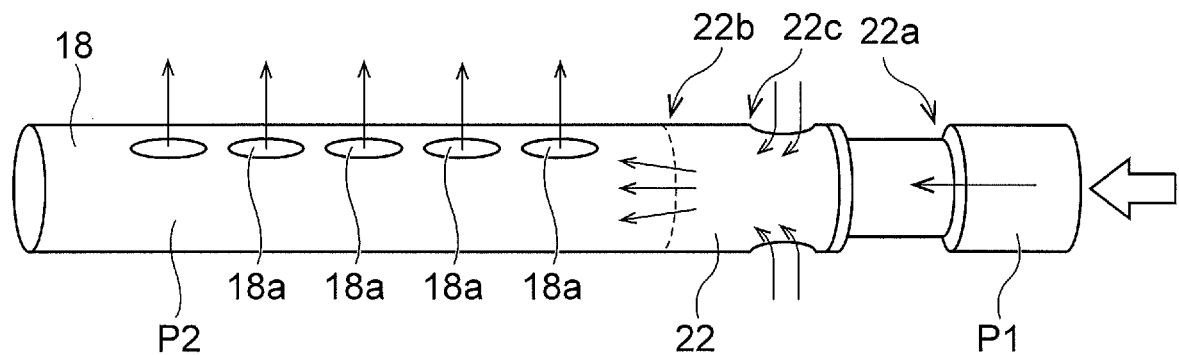
FIG. 5 is a perspective view illustrating a structure of a recirculating pipe of a second embodiment.

FIG. 5 is a perspective view illustrating a structure of the recirculating pipe 18 of the second embodiment.

The semiconductor manufacturing apparatus of the present embodiment includes an ejector 22 provided between a upstream portion P1 and a downstream portion P2 of the recirculating pipe 18, as illustrated in FIG. 5. The ejector 22 is arranged in the substrate treating tank 11 together with the recirculating pipe 18, and the plurality of openings 18a of the recirculating pipe 18 are provided in the downstream portion P2. Therefore, the liquid 2 of the present embodiment passes through the upstream portion P1, the ejector 22 and the downstream portion P2 in order, and is supplied into the substrate treating tank 11 via the openings 18a. The upstream portion P1 is an example of a first portion, and the downstream portion P2 is an example of a second portion.

The ejector 22 of the present embodiment may be formed of a same member as the upstream portion P1 and the downstream portion P2, or may be formed of a member different from the upstream portion P1 and the downstream portion P2 and fitted between the upstream portion P1 and the downstream portion P2. The ejector 22 of the present embodiment introduces the liquid 2 from the upstream portion P1 and jets out the liquid 2 to the downstream portion P2.

Each ejector 22 includes an opening 22a which introduces the liquid 2 from the upstream portion P1, and an opening 22b which ejects the liquid 2 to the downstream portion P2. Accordingly, the liquid 2 can be supplied from the upstream portion P1 to the downstream portion P2. The liquid 2 supplied to the downstream portion P2 is supplied from the openings 18a into the substrate treating tank 11. The opening 22b is an example of the first opening, and the opening 22a is an example of the second opening.

Each ejector 22 further includes at least one opening 22c which introduces the liquid 2 from the substrate treating tank 11. The ejector 22 of the present embodiment introduces the liquid 2 in the upstream portion P1 from the opening 22a, and introduces the liquid 2 in the substrate treating tank 11 from the opening 22c. The liquid 2 introduced from the opening 22a and the liquid 2 introduced from the opening 22c are joined in the ejector 22, and the joined liquid 2 is ejected from the opening 22b. In this way, the ejector 22 of the present embodiment not only supplies the liquid 2 introduced from the upstream portion P1 into the substrate treating tank 11 through the downstream portion P2 but also supplies the liquid 2 introduced from the substrate treating tank 11 into the substrate treating tank 11 again through the downstream portion P2. The opening 22c is an example of the third opening.

Figure 6:
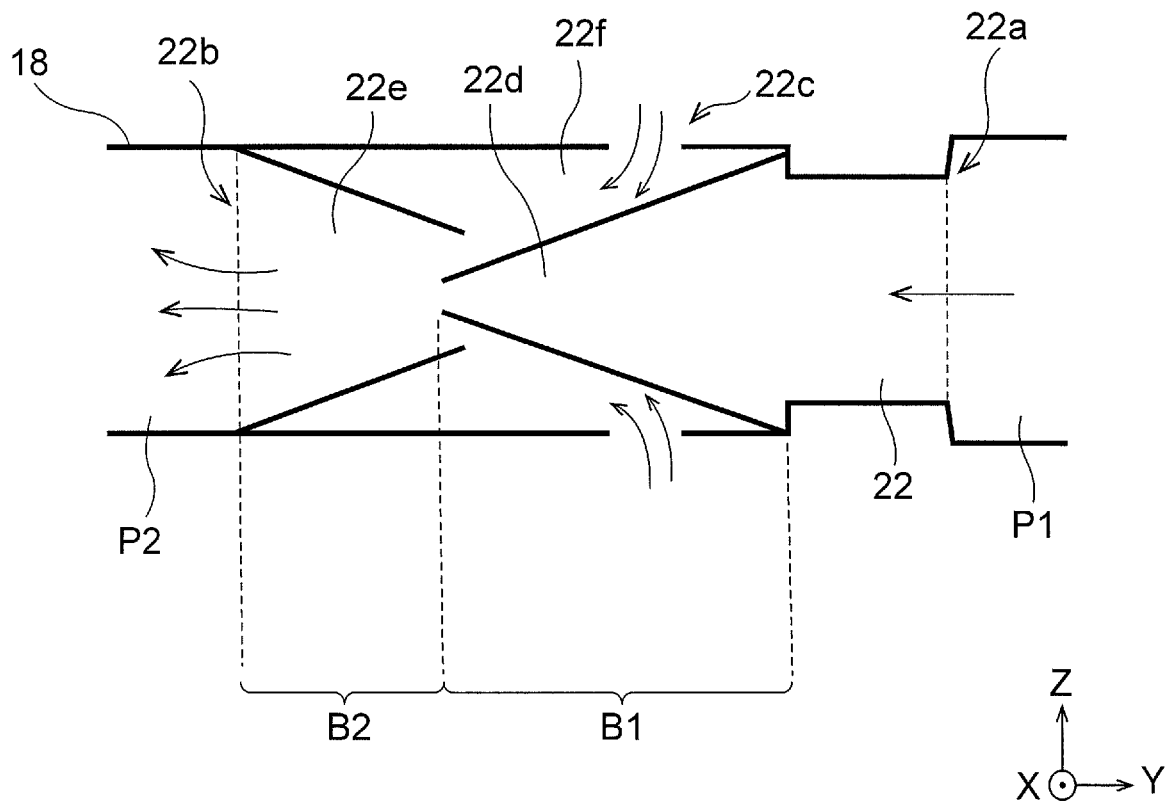
FIG. 6 is a sectional view illustrating a structure of an ejector of the second embodiment.

FIG. 6 is a sectional view illustrating a structure of the ejector 22 of the second embodiment.

The ejector 22 of the present embodiment includes, as illustrated in FIG. 6, the openings 22a, 22b and 22c and passages 22d, 22e and 22f. The passage 22d carries the liquid 2 from the opening 22a into the ejector 22, and the passage 22f carries the liquid 2 from the opening 22c into the ejector 22. The passage 22e carries the liquid 2 from the passage 22d and the passage 22f to the opening 22b. The passage 22e is an example of the first passage.

The liquid 2 introduced from the opening 22a passes through the passage 22d and flows into the ejector 22. Similarly, the liquid 2 introduced from the opening 22c passes through the passage 22f and flows into the ejector 22. The liquid 2 from the passage 22d and the liquid 2 from the passage 22f are joined in the ejector 22, and flow into the passage 22e. Accordingly, the liquid 2 joined in the ejector 22 passes through the passage 22e and is ejected from the opening 22b.

The passage 22d has an area B1 where a sectional area of the passage 22d becomes small as advancing downstream in the liquid 2. The passage 22d of the present embodiment has a tubular shape extending in the −Y direction and has a circular sectional shape. Therefore, a diameter of the passage 22d becomes small as advancing downstream in the liquid 2 (−Y direction) in the area B1. Accordingly, the flow velocity of the liquid 2 can be increased in the area B1. Further, by increasing the flow velocity of the liquid 2, the negative pressure can be generated near exits of the passage 22d and the passage 22f and the liquid 2 can be sucked from the opening 22c into the passage 22f (the Venturi effect).

On the other hand, the passage 22e has an area B2 where a sectional area of the passage 22e becomes large as advancing downstream in the liquid 2. The passage 22e of the present embodiment has a tubular shape extending in the −Y direction and has a circular sectional shape. Therefore, a diameter of the passage 22e becomes large as advancing downstream in the liquid 2 (−Y direction) in the area B2. Accordingly, the passage 22e can be made to function as the diffuser that mixes the liquid 2 from the passage 22d and the liquid 2 from the passage 22f.

According to the ejector 22 of the present embodiment, an effect similar to that of the ejector 21 of the first embodiment can be obtained. For example, by ejecting the liquid 2 from the ejector 22 to the downstream portion P2, the flow rate of the liquid 2 jetted from the openings 18a into the substrate treating tank 11 can be increased. Further, by providing the area B2 in the passage 22e, the passage 22e can be made to function as the diffuser. According to the present embodiment, similarly to the first embodiment, when treating the substrate 1 with the liquid 2, it is possible to suppress the occurrence of the problem in the substrates 1 and the liquid 2. The ejector 22 of the present embodiment may have a shape different from the shape illustrated in FIG. 6.

Third Embodiment

Figure 7:
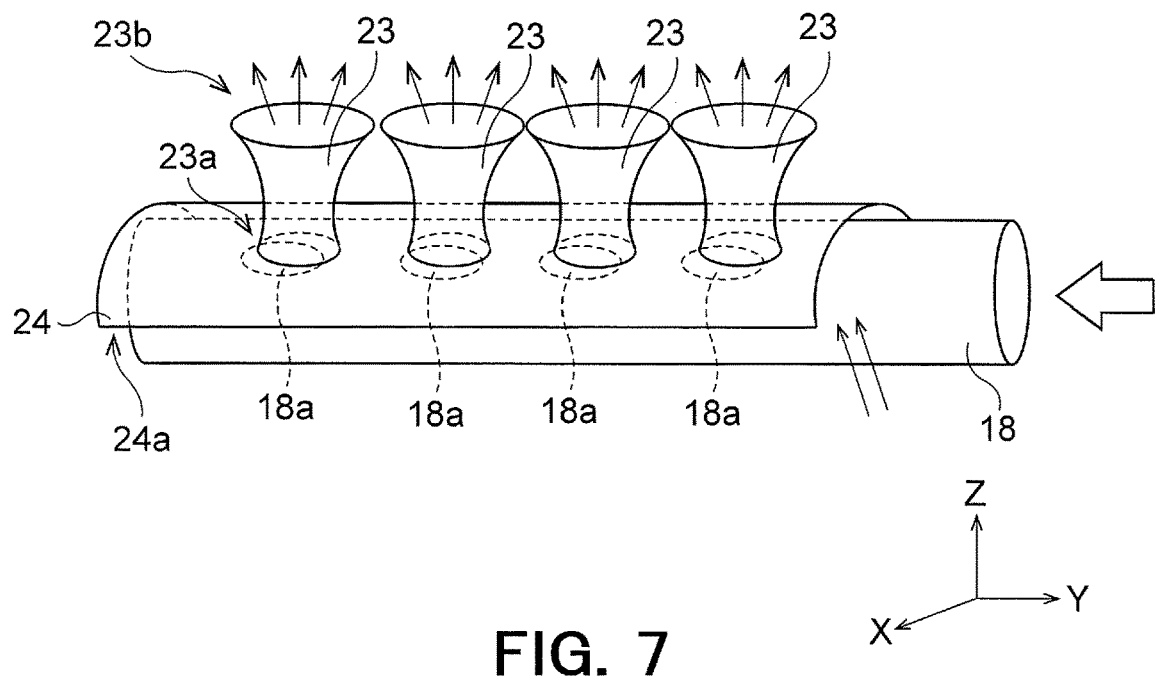
FIG. 7 is a perspective view illustrating a structure of a recirculating pipe of a third embodiment.

FIG. 7 is a perspective view illustrating a structure of the recirculating pipe 18 of the third embodiment.

The semiconductor manufacturing apparatus of the present embodiment includes an arch member 24 arranged so as to face the outer peripheral surface of the recirculating pipe 18 as illustrated in FIG. 7. The arch member 24 is arranged in the substrate treating tank 11, and has an arch shape extending along the outer peripheral surface of the recirculating pipe 18. A clearance between an inner peripheral surface of the arch member 24 and the outer peripheral surface of the recirculating pipe 18 is a passage of the liquid 2, and the liquid 2 in the substrate treating tank 11 is introduced into the passage from an opening 24a between the arch member 24 and the recirculating pipe 18.

The semiconductor manufacturing apparatus of the present embodiment further includes a plurality of ejectors 23 provided on the arch member 24 as illustrated in FIG. 7. The ejectors 23 are arranged in the substrate treating tank 11, and attached near the plurality of openings 18a of the recirculating pipe 18. Therefore, the liquid 2 flowing through the recirculating pipe 18 is supplied into the substrate treating tank 11 through the openings 18a and the ejectors 23. The arch member 24 is an example of a member.

The openings 18a of the present embodiment are in one-to-one correspondence with the clearances between the substrates 1, as described with reference to FIG. 2. Accordingly, the ejectors 23 of the present embodiment are also in one-to-one correspondence with the clearances between the substrates 1, and each ejector 23 jets out the liquid 2 to the corresponding clearance.

Each ejector 23 includes an opening 23a which introduces the liquid 2 from the recirculating pipe 18 (the opening 18a), and an opening 23b which ejects the liquid 2 into the substrate treating tank 11. Therefore, the liquid 2 can be supplied into the substrate treating tank 11 from the recirculating pipe 18. The opening 23b is an example of the first opening.

In the present embodiment, further, the liquid 2 introduced from the opening 24a also flows into the opening 23a through the passage between the arch member 24 and the recirculating pipe 18. Accordingly, the ejector 23 of the present embodiment introduces the liquid 2 in the recirculating pipe 18 and the liquid 2 in the substrate treating tank 11 from the opening 23a. The former liquid 2 and the latter liquid 2 are joined near the opening 23a, and the joined liquid 2 is ejected from the opening 23b. In this way, the ejector 23 of the present embodiment not only supplies the liquid 2 introduced from the recirculating pipe 18 into the substrate treating tank 11 but also supplies the liquid 2 introduced from the substrate treating tank 11 into the substrate treating tank 11 again.

Figure 8:
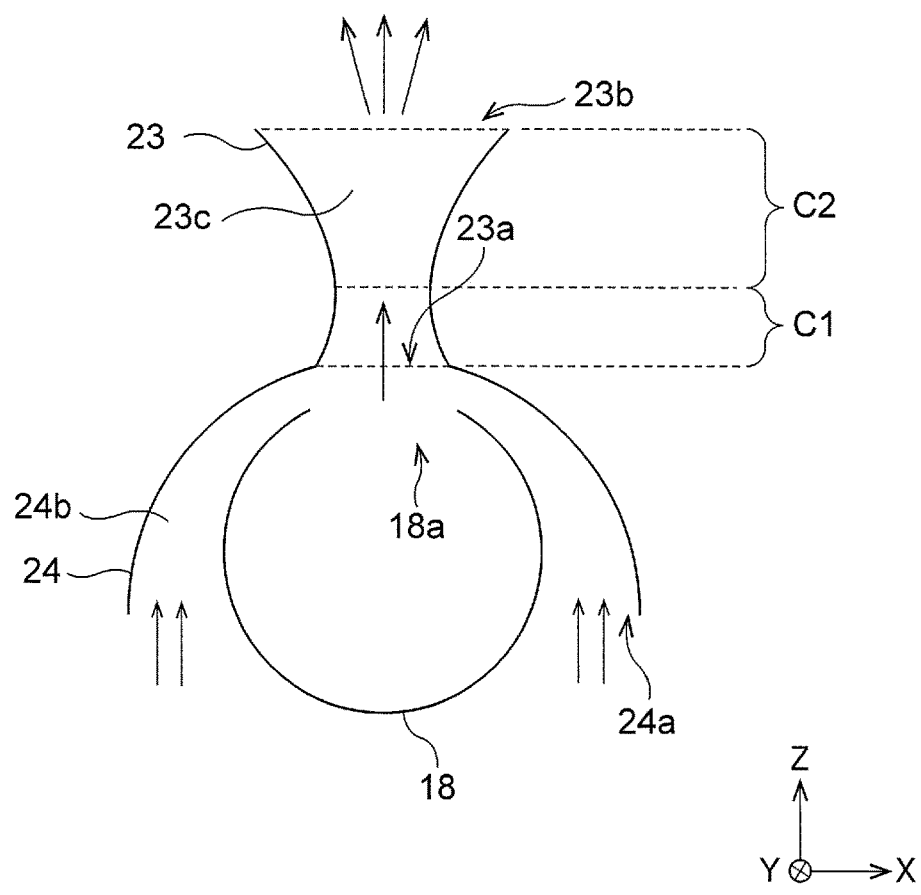
FIG. 8 is a sectional view illustrating a structure of an ejector of the third embodiment.

FIG. 8 is a sectional view illustrating a structure of the ejector 23 of the third embodiment.

As illustrated in FIG. 8, the ejector 23 of the present embodiment includes the openings 23a and 23b and a passage 23c, and the arch member 24 of the present embodiment forms the opening 24a and a passage 24b together with the recirculating pipe 18. The passage 24b is the clearance between the arch member 24 and the recirculating pipe 18, and carries the liquid 2 from the opening 24a to the opening 23a. The passage 23c carries the liquid 2 from the opening 18a and the passage 24b to the opening 23b. The passage 23c is an example of the first passage.

The liquid 2 introduced from the opening 24a passes through the passage 24b and reaches near the opening 23a. Similarly, the liquid 2 jetted out from the opening 18a reaches near the opening 23a. The liquid 2 from the passage 24b and the liquid 2 from the opening 18a are joined near the opening 23a, and flow into the passage 23c. Accordingly, the liquid 2 joined near the opening 23a passes through the passage 23c and is ejected from the opening 23b.

The passage 23c has a horn-like shape, and has an area C1 where a sectional area of the passage 23c becomes small as advancing downstream in the liquid 2 and an area C2 where a sectional area of the passage 23c becomes large as advancing downstream in the liquid 2 in order. The passage 23c of the present embodiment has a tubular shape extending in the +Z direction and has a circular sectional shape. Therefore, a diameter of the passage 23c becomes small as advancing downstream in the liquid 2 (+Z direction) in the area C1. In addition, the diameter of the passage 23c becomes large as advancing downstream in the liquid 2 (+Z direction) in the area C2. Accordingly, the passage 23c can be made to function as the diffuser that mixes the liquid 2 from the opening 18a and the liquid 2 from the passage 24b.

According to the ejector 23 of the present embodiment, the effect similar to that of the ejector 21 of the first embodiment can be obtained. For example, by ejecting the liquid 2 from the ejector 23, the flow rate of the liquid 2 jetted into the substrate treating tank 11 can be increased. Further, by providing the area C2 in the passage 23c, the passage 23c can be made to function as the diffuser. Accordingly to the present embodiment, similarly to the first embodiment, when treating the substrate 1 with the liquid 2, it is possible to suppress the occurrence of the problem in the substrates 1 and the liquid 2. The ejector 23 of the present embodiment may have a shape different from the shape illustrated in FIG. 8.

Fourth Embodiment

Figure 9:
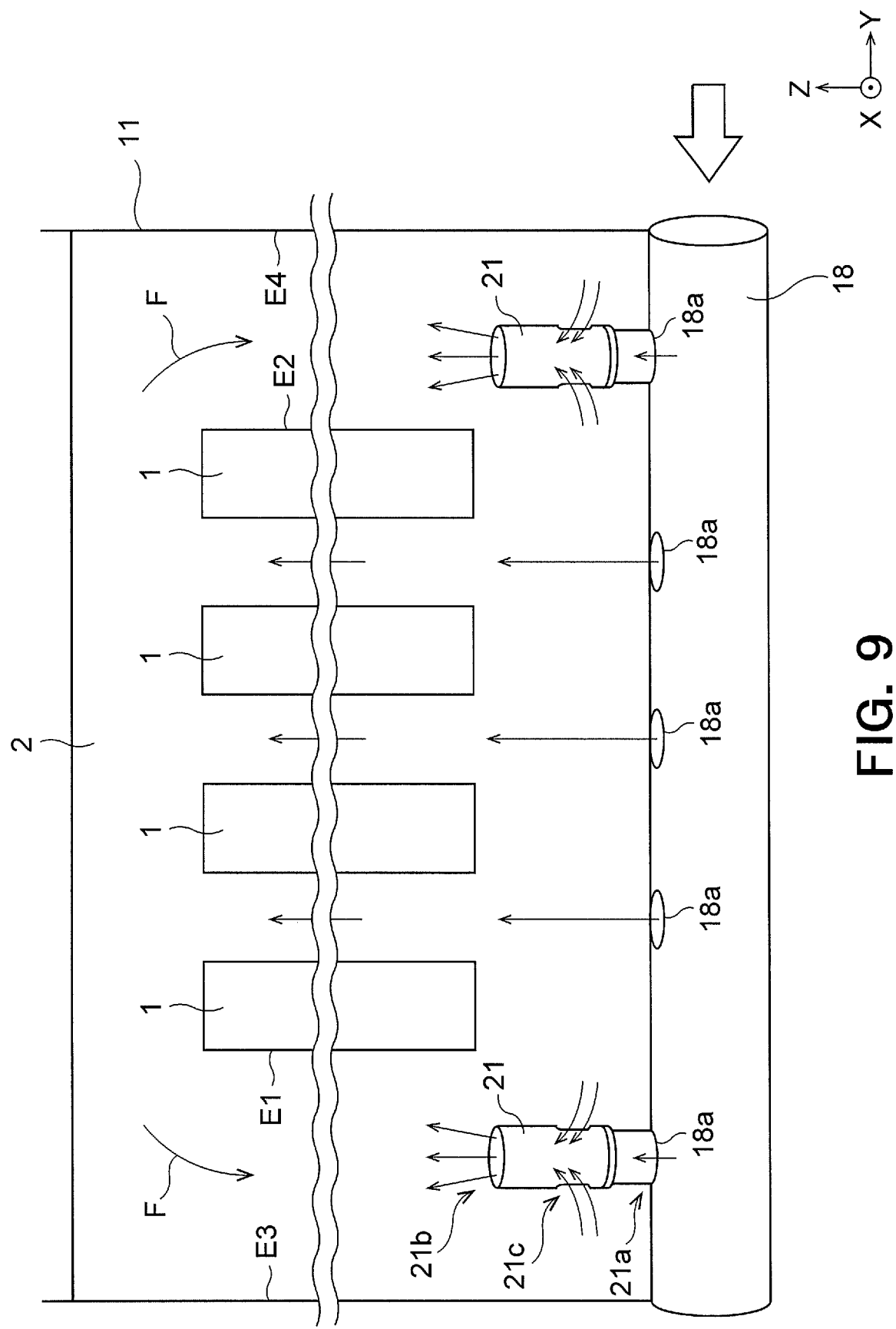
FIG. 9 is a sectional view illustrating a structure of a substrate treating tank of a fourth embodiment.

FIG. 9 is a sectional view illustrating a structure of the substrate treating tank 11 of the fourth embodiment.

FIG. 9 illustrates the plurality of substrates 1 contained in the substrate treating tank 11 and the plurality of openings 18a provided on one recirculating pipe 18. The substrates 1 are held so as to be arranged in parallel to each other, and as a result, the plurality of clearances are provided between the substrates 1.

FIG. 9 illustrates a main surface E1 of the substrate 1 at a left end of the substrates 1, a main surface E2 of the substrate 1 at a right end of the substrates 1, a wall surface E3 of an inner wall of the substrate treating tank 11, and another wall surface E4 of the inner wall of the substrate treating tank 11. The wall surface E3 faces the main surface E1, and the wall surface E4 faces the main surface E2. The main surface E1 may be the surface S1 or the back surface S2 of the substrate 1. Similarly, the main surface E2 may be the surface S1 or the back surface S2 of the substrate 1. As illustrated by arrows in FIG. 9, the openings 18a of the recirculating pipe 18 jet out the liquid 2 to the clearances between the substrates 1, the clearance between the main surface E1 and the wall surface E3, and the clearance between the main surface E2 and the wall surface E4.

The ejector 21 of the present embodiment has the same structure as the ejector 21 described in the first embodiment, and is attached to the opening 18a corresponding to the clearance between the main surface E1 and the wall surface E3 and the opening 18a corresponding to the clearance between the main surface E2 and the wall surface E4. Therefore, the ejector 21 of the present embodiment ejects the liquid 2 from the opening 21b to the clearance between the main surface E1 and the wall surface E3 and the clearance between the main surface E2 and the wall surface E4.

In the present embodiment, the clearance between the main surface E1 and the wall surface E3 and the clearance between the main surface E2 and the wall surface E4 are set wider than the clearances between the substrates 1. Accordingly, it is possible that the flow of the liquid 2 in the substrate treating tank 11 stagnates at the clearance between the main surface E1 and the wall surface E3 and the clearance between the main surface E2 and the wall surface E4.

Then, in the present embodiment, the liquid 2 from the ejector 21 is ejected to the clearance between the main surface E1 and the wall surface E3 and the clearance between the main surface E2 and the wall surface E4. Specifically, the liquid 2 from the ejector 21 is made to hit the downward flow of the liquid 2 as illustrated by an arrow F. Therefore, the stagnation of the flow of the liquid 2 as described above can be suppressed.

The ejector 21 of the present embodiment may be applied to the semiconductor manufacturing apparatus of any one of the first to third embodiments. For example, the ejectors 21 of the present embodiment may be attached to the openings 18a corresponding to the clearances between the substrates 1, the opening 18a corresponding to the clearance between the main surface E1 and the wall surface E3, and the opening 18a corresponding to the clearance between the main surface E2 and the wall surface E4. In addition, the ejector 21 of the present embodiment may be replaced with the ejector 23 of the third embodiment.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a container configured to contain a substrate;
a pipe configured to supply the container with liquid to treat the substrate; and
an ejector including a first opening, a second opening configured to introduce the liquid from the pipe, a third opening configured to introduce the liquid from the container, a second passage where the liquid introduced from the second opening passes through, a third passage where the liquid introduced from the third opening passes through, and a first passage where the liquid having passed through the second passage and the liquid having passed through the third passage are joined and pass through, the first opening being configured to eject the liquid that has passed through the first passage,
wherein the liquid introduced from the second opening and the liquid introduced from the third opening are not joined in the second passage and the third passage, and are joined in the first passage,
wherein the first passage has an area where a sectional area of the first passage becomes large as advancing downstream in the liquid, and
wherein the ejector is attached to the pipe or included in the pipe.

2. The apparatus of claim 1, further comprising a substrate holder configured to hold a plurality of substrates in the container such that the substrates are arranged in parallel to each other,
wherein the ejector is provided on an outer peripheral surface of the pipe in the container, and ejects the liquid to clearances between the substrates.

3. The apparatus of claim 1, further comprising a substrate holder configured to hold a plurality of substrates in the container such that the substrates are arranged in parallel to each other,
wherein the ejector is provided on an outer peripheral surface of the pipe in the container, and ejects the liquid between a substrate disposed at an end of the plurality of substrates and an inner wall of the container.

4. The apparatus of claim 1, wherein the ejector is provided between a first portion and a second portion of the pipe, introduces the liquid from the first portion, and ejects the liquid to the second portion.

5. The apparatus of claim 1, wherein
the liquid introduced from the second opening only passes through the second passage out of the second passage and the third passage, and
the liquid introduced from the third opening only passes through the third passage out of the second passage and the third passage.

6. The apparatus of claim 1, wherein the liquid in the container is introduced from the third opening into the third passage by being sucked due to a negative pressure generated by a flow of the liquid in the ejector.

7. The apparatus of claim 1, further comprising a silica remover configured to remove silica from the liquid discharged from the container, the liquid from which the silica is removed by the silica remover being supplied to the pipe.

* * * * *